United States Patent
Kluge et al.

(10) Patent No.: US 7,295,824 B2
(45) Date of Patent: Nov. 13, 2007

(54) FREQUENCY MULTIPLIER PRE-STAGE FOR FRACTIONAL-N PHASE-LOCKED LOOPS

(75) Inventors: Wolfram Kluge, Dresden (DE);
Torsten Bacher, Kurort Hartha (DE);
Rolf Jaehne, Ottendorf-Okrilla (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 376 days.

(21) Appl. No.: 10/964,865

(22) Filed: Oct. 14, 2004

(65) Prior Publication Data

US 2005/0245200 A1    Nov. 3, 2005

(30) Foreign Application Priority Data

Apr. 30, 2004    (DE) ................ 10 2004 021 224

(51) Int. Cl.
*H04B 1/06* (2006.01)
*H04B 7/00* (2006.01)

(52) U.S. Cl. ............ 455/260; 455/255; 455/257; 455/264; 455/265; 331/53

(58) Field of Classification Search ........... 455/260, 455/255–259, 264–265; 331/53, 39
See application file for complete search history.

(56) References Cited

U.S. PATENT DOCUMENTS

| | | | |
|---|---|---|---|
| 5,757,239 A * | 5/1998 | Gilmore | ............ 331/18 |
| 6,005,420 A * | 12/1999 | Yoshizawa et al. | ......... 327/116 |
| 6,380,811 B1 * | 4/2002 | Zarubinsky et al. | .......... 331/18 |
| 6,759,910 B2 | 7/2004 | Ammar et al. | |
| 6,856,203 B2 | 2/2005 | Dey | |
| 6,901,126 B1 | 5/2005 | Gu | |
| 2002/0125924 A1 * | 9/2002 | Kurogouchi et al. | ........ 327/119 |

FOREIGN PATENT DOCUMENTS

DE    101 48 238 A1    9/2002
EP    0 800 276 A1    1/1997

OTHER PUBLICATIONS

Official Communication, 10 2004 021 224.4-35, mailed Dec. 3, 2004.

(Continued)

*Primary Examiner*—Edan Orgad
*Assistant Examiner*—RuiMeng Hu
(74) *Attorney, Agent, or Firm*—Meyertons Hood Kivlin Kowert & Goetzel, P.C.; B. Noël Kivlin

(57) ABSTRACT

A WLAN (Wireless Local Area Network) communication device comprising a WLAN frequency synthesizer for generating a synthesizer signal suitable for modulating a transmission signal and/or demodulating a reception signal and corresponding methods and integrated circuit chips are provided. The WLAN frequency synthesizer comprises a reference oscillator for generating a first reference clock signal, a fractional-N PLL (Phase-Locked Loop) unit for receiving a second reference clock signal and converting the second reference clock signal into the synthesizer signal, and a frequency multiplier for receiving the first reference clock signal and converting the first reference clock signal into the second reference clock signal to be forwarded to the fractional-N PLL unit by multiplying the frequency of the first reference clock signal by a multiplication factor. Embodiments may provide shorter settling times and/or enhanced spurious suppression of the fractional-N PLL unit.

26 Claims, 2 Drawing Sheets

OTHER PUBLICATIONS

Hyungki Huh, et al.; "A CMOS Dual Band Fractional-N Synthesizer with Reference Doubler and Compensated Charge Pump"; IN: IEEE Intern Solid-State Circuits Conf., Feb. 15-19, 2004, vol. 1, Chapter 5.6.

Masoud Zargari, et al.; "A 5-Ghz CMOS Transceiver for IEEE 802, 11a Wireless LAN Systems"; IEEE Journal of Solid-State Circuits, vol. 37, No. 12, Dec. 2002, pp. 1688-1694.

* cited by examiner

FREQUENCY MULTIPLIER PRE-STAGE FOR FRACTIONAL-N PHASE-LOCKED LOOPS

BACKGROUND OF THE INVENTION

1. Field of the Invention

The present application relates to WLAN (Wireless Local Area Network) communication devices including a WLAN frequency synthesizer for generating a synthesizer signal and corresponding methods and integrated circuit chips, and in particular to the pre-processing of a reference clock signal provided to a fractional-N PLL (Phase-Locked Loop) unit within the frequency synthesizer.

2. Description of the Related Art

A wireless local area network is a flexible data communication system implemented as an extension to or as an alternative for a wired LAN. Using radio frequency or infrared technology, WLAN systems transmit and receive data over the air minimizing the need for wired connections. Thus, WLAN systems combine data connectivity with user mobility.

Today most WLAN systems use spread spectrum technology, a wideband radio frequency technique developed for use in reliable and secure communication systems. The spread spectrum technology is designed to trade off bandwidth efficiency for reliability, integrity and security. Two types of spread spectrum radio systems are frequently used: frequency hopping and direct sequence systems.

For generating a carrier signal suitable for the up-conversion of transmission signals and/or the down-conversion of reception signals, WLAN communication devices, i.e. transmitters, receivers and transceivers, include a frequency synthesizer. The frequency synthesizer comprises a very stable reference oscillator providing a reference clock signal and translates the frequency of the reference clock signal to the desired radio or infrared frequency. The frequency translation is usually achieved by a PLL unit which requires only a few components and is easily integrated.

FIG. 1 shows the components of a typical PLL-based frequency synthesizer. A VCO (Voltage-Controlled Oscillator) oscillator 160 outputs the carrier signal at an output frequency $f_{OUT}$. The output frequency $f_{OUT}$ can be varied by varying a control voltage supplied to the VCO oscillator 160.

Part of the carrier signal is split and provided to a frequency divider 170. The frequency divider 170 divides the output frequency $f_{OUT}$ of the carrier signal by a division factor which can be selected by the controller 180. The resulting divider signal at the frequency $f'_{OUT}$ is provided to a comparator.

A reference oscillator 110 generates a reference clock signal at a reference frequency $f_{REF}$. Also the reference clock signal is provided to the comparator.

The comparator, typically a phase detector or a PFD (Phase/Frequency Detector) detector 130, compares the divider signal with the reference clock signal and outputs an error signal that quantitatively indicates the phase difference between the two signals. The error signal is provided to a charge pump 140 that converts the error signal into either positive or negative charge pulses depending on whether the reference clock signal phase leads or lags the divider signal phase. These charge pulses are integrated by a loop filter 150 to generate the control voltage applied to the VCO oscillator 160 for moving the output frequency $f_{OUT}$ up or down until the phases are synchronized.

As illustrated in FIG. 1, the frequency synthesizer basically comprises the reference oscillator 110 and the PLL unit 120 comprising the PFD detector 130, the charge pump 140, the loop filter 150, the VCO oscillator 160, the frequency divider 170 and the controller 180.

The PLL unit 120 may be a fractional-N PLL unit. In a fractional-N PLL unit 120, the frequency divider 170 may be continually varied in a way that allows the average modulus to be specified with sub-integer ("fractional") precision. The increased frequency divider resolution allows the reference frequency $f_{REF}$ to be significantly larger than the desired output frequency step size. However, since WLAN frequency synthesizers usually use crystal oscillators as the reference oscillator 110, reference frequencies $f_{REF}$ of up to 40 MHz only are available.

Even when the fractional-N PLL unit 120 is locked, the charge pump 140 still outputs small charge pulses caused, e.g., by non-ideal phase/frequency detection in the PFD detector 130. These pulses create sidebands, or spurs, in the output spectrum of the VCO oscillator 160 at offset frequencies equal to the reference frequency $f_{REF}$. For sufficiently suppressing those spurs, the loop filter 150 may need to have a loop filter bandwidth narrower than, e.g., 1% of the reference frequency $f_{REF}$.

However, there is a tradeoff between spurious suppression and loop dynamics in the fractional-N PLL unit 120. While a narrow loop filter bandwidth is required for spurious suppression, a wide loop filter bandwidth is needed for short settling times.

The settling time of a fractional-N PLL unit 120 is the time required for re-achieving stable operation once the desired output frequency $f_{OUT}$ of the carrier signal has been changed. Particularly in frequency hopping WLAN systems, it is critical to quickly re-lock the fractional-N PLL unit 120 after hopping from one output frequency $f_{OUT}$ to another.

As indicated above, the loop filter bandwidth is for instance limited to 1% of the reference frequency $f_{REF}$ for achieving sufficient spurious suppression. Since in prior art techniques, usually crystal oscillators are used for the reference oscillator 110 which provide reference frequencies of up to 40 MHz only, many conventional WLAN communication devices suffer from long settling times. This often leads to problems in achieving efficient transmission data rates.

Other conventional approaches decrease the settling time by using wider loop filter bandwidths. However, such systems generally have the disadvantage of suppressing spurious emissions only insufficiently. In consequence, the transmission quality is significantly reduced.

The tradeoff between spurious suppression and loop dynamics could be eased by using reference oscillators 110 that provide a higher reference frequency $f_{REF}$. This may allow for increasing the loop filter bandwidth, i.e. decreasing the settling time, while still remaining below 1% of the reference frequency $f_{REF}$, i.e. maintaining or even enhancing the spurious suppression.

There are crystal oscillators obtainable providing reference frequencies $f_{REF}$ superior to 40 MHz. However, such high frequency crystal oscillators are considerably more expensive than regular crystal oscillators. Thus, prior art WLAN communication devices employing high frequency crystal oscillators produce higher manufacturing costs and are therefore less competitive.

Further, high frequency crystal oscillators consume significantly more power than standard crystal oscillators. In consequence, existing WLAN communication devices based on high frequency crystal oscillators often have the disadvantage of providing only short battery lifetimes. Alternatively, conventional WLAN communication devices may include improved but expensive storage batteries. This again leads to the problem of increased product costs.

In addition, high frequency crystal oscillators are less reliable than standard crystal oscillators because of providing less frequency stability. In particular, high frequency crystal oscillators often reveal an increased frequency drift. Thus, the output frequency $f_{OUT}$ of a fractional-N PLL unit 120 locked to a high frequency crystal oscillator also suffers from an increased frequency instability. This results in that many prior art WLAN communication devices fail to keep the specified frequency accuracy.

SUMMARY OF THE INVENTION

An improved WLAN communication device including a fractional-N PLL-based frequency synthesizer and corresponding methods and integrated circuit chips are provided that may overcome the disadvantages of the conventional approaches. Embodiments may allow for enhancing the tradeoff between spurious suppression and loop dynamics. Other embodiments may provide higher transmission data rates. In other embodiments, transmission signal quality may be improved. Further embodiments may increase the battery lifetime. Still other embodiments may allow for reducing the product costs. Moreover, embodiments may provide increased frequency accuracy.

In one embodiment, a WLAN communication device comprising a WLAN frequency synthesizer arranged to generate a synthesizer signal suitable for modulating a transmission signal and/or demodulating a reception signal is provided. The WLAN frequency synthesizer comprises a reference oscillator, a fractional-N PLL unit and a frequency multiplier. The reference oscillator is arranged to generate a first reference clock signal. The fractional-N PLL unit is arranged to receive a second reference clock signal and to convert the second reference clock signal into the synthesizer signal. The frequency multiplier is arranged to receive the first reference clock signal and to convert the first reference clock signal into the second reference clock signal to be forwarded to the fractional-N PLL unit by multiplying the frequency of the first reference clock signal by a multiplication factor.

In another embodiment, an integrated circuit chip comprising a WLAN frequency synthesizer circuit for generating a synthesizer signal suitable for modulating a transmission signal and/or demodulating a reception signal is provided. The WLAN frequency synthesizer circuit comprises a reference oscillator circuit, a fractional-N PLL circuit and a frequency multiplier circuit. The reference oscillator circuit is for generating a first reference clock signal. The fractional-N PLL circuit is for receiving a second reference clock signal and converting the second reference clock signal into the synthesizer signal. The frequency multiplier circuit is for receiving the first reference clock signal and converting the first reference clock signal into the second reference clock signal to be forwarded to the fractional-N PLL circuit by multiplying the frequency of the first reference clock signal by a multiplication factor.

In a further embodiment, a method of operating a WLAN communication device comprising generating by a WLAN frequency synthesizer a synthesizer signal suitable for modulating a transmission signal and/or demodulating a reception signal is provided. The step of generating the synthesizer signal comprises generating a first reference clock signal by operating a reference oscillator. Further, the step of generating the synthesizer signal comprises receiving a second reference clock signal and converting the second reference clock signal into the synthesizer signal by a fractional-N PLL unit. Moreover, the step of generating the synthesizer signal comprises converting the first reference clock signal into the second reference clock signal to be forwarded to the fractional-N PLL unit by multiplying the frequency of the first reference clock signal by a multiplication factor by a frequency multiplier.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings wherein like elements and structures are indicated by like reference numbers.

Figure 2:
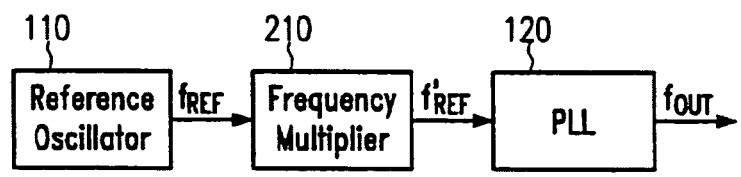
FIG. 2 is a block diagram illustrating the components of a frequency synthesizer according to an embodiment.

Referring now to FIG. 2, a frequency synthesizer according to an embodiment is shown. The frequency synthesizer comprises a reference oscillator 110, a frequency multiplier 210 and a fractional-N PLL unit 120. The reference oscillator 110 is outputting a first reference clock signal at a first reference frequency $f_{REF}$. The first reference clock signal is provided to the frequency multiplier 210 which converts the first reference clock signal into a second reference clock signal by multiplying the frequency of the first reference clock signal by a multiplication factor. The resulting second reference clock signal at a second reference frequency $f'_{REF}$ is forwarded to the fractional-N PLL unit 120. The fractional-N PLL unit 120 converts the second reference clock signal into an output signal at an output frequency $f_{OUT}$.

According to the present embodiment, the reference oscillator 110 is a crystal oscillator. In particular, the reference oscillator 110 may be an uncontrolled crystal oscillator. In other embodiments, the reference oscillator 110 may be a controlled crystal oscillator, e.g., a voltage-controlled crystal oscillator, a temperature-controlled crystal oscillator or an oven-controlled crystal oscillator. Other types of oscillators may also be used for the reference oscillator 110.

Figure 1:
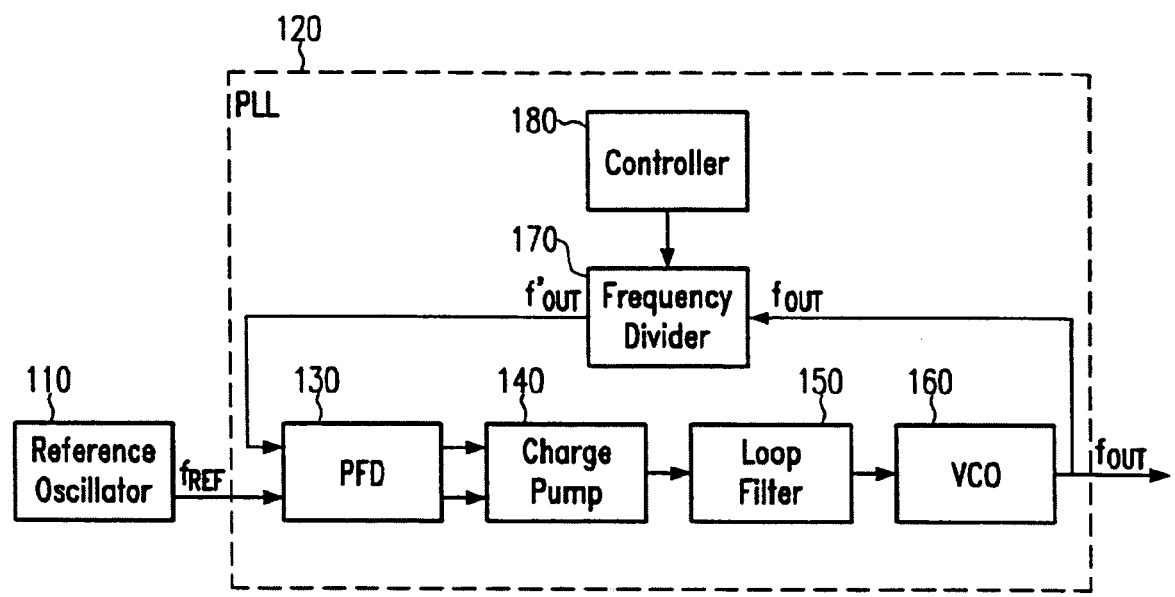
FIG. 1 is a block diagram illustrating the components of a frequency synthesizer according to prior art.

The fractional-N PLL unit 120 may comprise the PFD detector 130, the charge pump 140, the loop filter 150, the VCO oscillator 160, the frequency divider 170 and the controller 180 described above with reference to FIG. 1. Instead of the PFD detector 130, the fractional-N PLL unit 120 may include a phase detector or any other type of comparator suitable for performing phase-locking. In addition, the fractional-N PLL unit 120 may comprise further components, e.g., self-calibration circuitry, components for determining the operating mode of the fractional-N PLL unit 120, or components for optimizing the operating parameters of the fractional-N PLL unit 120.

The frequency multiplier 210 may double the first reference frequency $f_{REF}$ or multiply the first reference frequency $f_{REF}$ by an integer multiplication factor. In other embodiments, the frequency multiplier 210 may also allow for multiplying the first reference frequency $f_{REF}$ by a fractional multiplication factor.

The first reference frequency $f_{REF}$ may be multiplied by a fixed multiplication factor by the frequency multiplier 210. Alternatively, the multiplication factor employed by the frequency multiplier 210 may be selectable. In such an embodiment, the frequency synthesizer may further comprise a multiplication controller for selecting the multiplication factor.

As discussed above, the loop filter 150 may have a loop filter bandwidth narrower than 1% of the reference frequency supplied to the fractional-N PLL unit 120 in order to achieve sufficient spurious suppression. As the second reference frequency $f'_{REF}$ which is provided to the fractional-N PLL unit 120 according to the present embodiment may be superior to the first reference frequency $f_{REF}$, wider loop bandwidths may be applied than in conventional systems where the first reference clock signal is provided directly from the reference oscillator 110 to the fractional-N PLL unit 120. Thus, by selecting a loop filter bandwidth wider than 1% of the first reference frequency $f_{REF}$ but narrower than 1% of the second reference frequency $f'_{REF}$, both better spurious suppression and shorter settling times than in prior art WLAN communication devices may be achieved without the need for a high frequency crystal oscillator.

Figure 3:
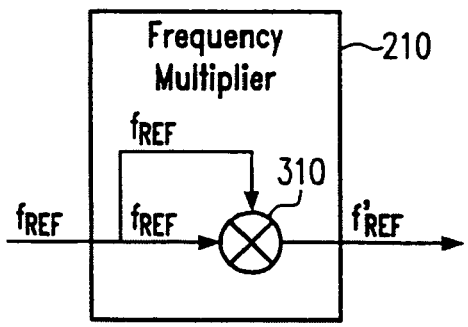
FIG. 3 is a block diagram illustrating the components of the frequency multiplier within the frequency synthesizer of FIG. 2 according to an embodiment.

In FIG. 3, the components of the frequency multiplier 210 according to an embodiment are shown. In this embodiment, the frequency multiplier 210 comprises a mixer 310. The first reference clock signal at the first reference frequency $f_{REF}$ provided to the frequency multiplier 210, which may for instance be a sine signal, may be split and self-mixed by the mixer 310 in order to generate the second reference clock signal at the second reference frequency $f'_{REF}$.

In this embodiment, the second reference frequency $f'_{REF}$ is twice the first reference frequency $f_{REF}$. In other embodiments, the frequency multiplier 210 may include a plurality of serially arranged mixers 310. By splitting the output signal of each mixer 310 and self-mixing it by the subsequent mixer 310, a multiplication factor of $2^n$ may be achieved wherein n is the number of mixers 310 within the frequency multiplier 210. By other mixer arrangements, other multiplication factors may also be realized.

Figure 4:
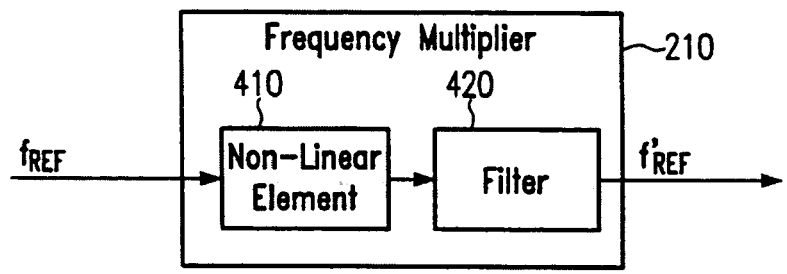
FIG. 4 is a block diagram illustrating the components of the frequency multiplier within the frequency synthesizer of FIG. 2 according to another embodiment.

Turning now to FIG. 4, the components of the frequency multiplier 210 according to another embodiment are shown. In this embodiment, the frequency multiplier 210 comprises a non-linear element 410 and a filter 420. The reference oscillator 110 may provide the first reference clock signal at the first reference frequency $f_{REF}$ to the non-linear element 410. When the first reference clock signal is passed through the non-linear element 410, the non-linear element 410 may create tones at the harmonics of the original signal, i.e. at integer multiples of the first reference frequency $f_{REF}$. For the non-linear element 410, for instance, a diode, a transistor or a varactor may be used.

The harmonically rich signal produced by the non-linear element 410 may be passed through the filter 420 for selecting one of its harmonic components as the second reference clock signal. According to the present embodiment, the filter 420 is a band filter attenuating the undesired harmonic components of the signal produced by the non-linear element 410. However, other types of filters and/or more than one filter may be used for filtering the harmonic signal.

Figure 5:
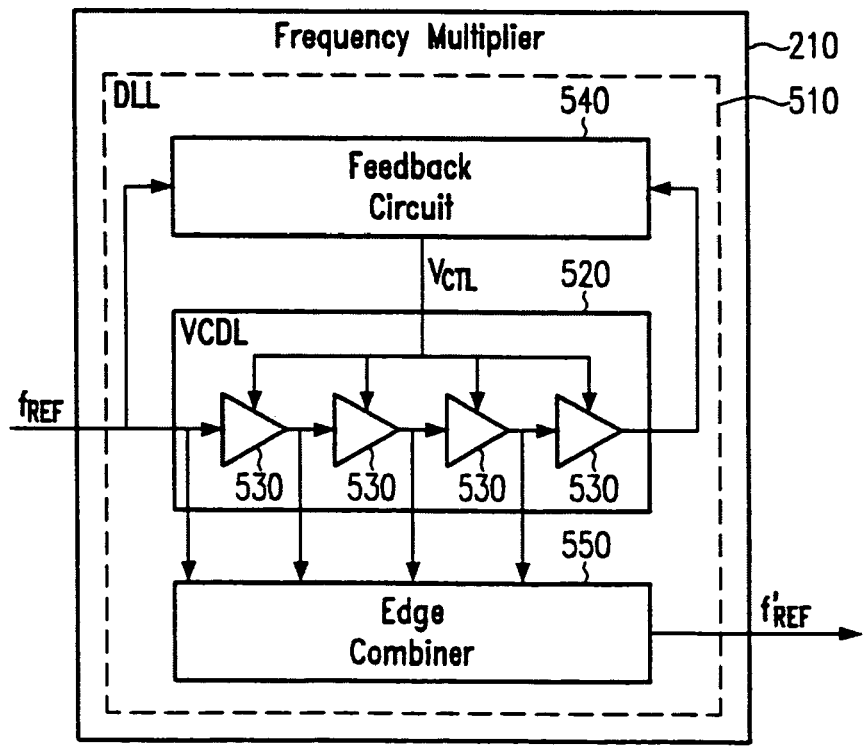
FIG. 5 is a block diagram illustrating the components of the frequency multiplier within the frequency synthesizer of FIG. 2 according to a further embodiment.

FIG. 5 illustrates the components of the frequency multiplier 210 according to a further embodiment. In this embodiment, the frequency multiplier 210 comprises a DLL (Delay-Locked Loop) unit 510 for converting the first reference clock signal at the first reference frequency $f_{REF}$ into the second reference clock signal at the second reference frequency $f'_{REF}$.

The DLL unit 510 may comprise a VCDL (Voltage Control Delay Line) unit 520, a feedback circuit 540 and an edge combiner 550. The first reference clock signal may be supplied to a plurality of serially arranged delay elements 530. Before each of the delay elements 530, part of the signal may be split and provided to the edge combiner 550. The edge combiner 550 may combine those signals in order to generate the second reference clock signal at the second reference frequency $f'_{REF}$.

Part of the first reference clock signal may be split and provided to the feedback circuit 540. Also, the signal leaving the last delay element 530 of the VCDL unit 520 may be supplied to the feedback circuit 540. The feedback circuit 540 may compare the signal arriving from the last delay element 530 of the VCDL unit 520 with the first reference clock signal, and synchronize the signal from the last delay element 530 in phase and frequency with the first reference clock signal by applying a control voltage to the delay elements 530 of the VCDL unit 520. For this purpose, the feedback circuit 540 may comprise a phase detector or PFD detector 130, a charge pump 140 and a loop filter 150 described above with reference to FIG. 1.

As apparent from the above description of embodiments, a fractional-N synthesizer with high reference frequency is provided. Fractional-N synthesizers are the only approach to get fine frequency resolution. Spurious suppression may be accomplished by a loop filter having a loop filter bandwidth narrower than 1% of the first reference frequency $f_{REF}$. This may lead to long settling times in conventional approaches.

Fast settling and fine frequency resolution may only be possible with high reference frequencies. Therefore, the frequency multiplier 210 may be placed in between the crystal reference oscillator 110 and the fractional-N PLL unit 120.

The described embodiments may provide the advantage of a faster settling process of the fractional-N PLL unit 120. When the same loop filter 150 is used as if the first reference clock signal at the first reference frequency $f_{REF}$ would be supplied directly to the fractional-N PLL unit 120, the discussed embodiments may also allow for better spurious signal suppression: the loop filter bandwidth being narrower than 1% of the first reference frequency $f_{REF}$ is much narrower than the second reference frequency $f'_{REF}$. Additionally, these advantages may be achieved using a cheap crystal oscillator for the reference oscillator 110 without the need for expensive, power-consuming, and less accurate high frequency crystal oscillators 110.

Thus, the embodiments may not only improve the spurious rejection, the signal-to-noise ratio, the efficiency, and operating speed of WLAN communication devices, but also save their power consumption, reduce manufacturing costs and improve accuracy/precision and reliability.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A WLAN (Wireless Local Area Network) communication device comprising a WLAN frequency synthesizer arranged to generate a synthesizer signal suitable for modulating a transmission signal and/or demodulating a reception signal, wherein the WLAN frequency synthesizer comprises:
    a reference oscillator arranged to generate a first reference clock signal;
    a fractional-N PLL (Phase-Locked Loop) unit arranged to receive a second reference clock signal and to convert the second reference clock signal into the synthesizer signal; and
    a frequency multiplier arranged to receive the first reference clock signal and to convert the first reference clock signal into the second reference clock signal to be forwarded to said fractional-N PLL unit by multiplying the frequency of the first reference clock signal by a multiplication factor;
    wherein the fractional-N PLL unit comprises a VCO (Voltage Controlled Oscillator) oscillator arranged to output the synthesizer signal and a loop filter arranged to generate a control voltage for controlling the operation of the VCO oscillator; and
    wherein the loop filter is further arranged to operate at a loop filter bandwidth narrower than or equal to one percent of the frequency of the second reference clock signal and broader than one percent of the frequency of the first reference clock signal.

2. The WLAN communication device of claim 1, wherein the frequency multiplier comprises a DLL (Delay-Locked Loop) unit arranged to multiply the frequency of the first reference clock signal by said multiplication factor.

3. The WLAN communication device of claim 1, wherein the frequency multiplier comprises a mixer arranged to self-mix the first reference clock signal.

4. The WLAN communication device of claim 1, wherein the frequency multiplier comprises a harmonic generator arranged to convert the first reference clock signal into a harmonic signal comprising at least one component at a frequency of an integer multiple of the frequency of the first reference clock signal.

5. The WLAN communication device of claim 4, wherein the frequency multiplier further comprises a filter arranged to select one of the at least one component of the harmonic signal as the second reference clock signal.

6. The WLAN communication device of claim 1, wherein the frequency multiplier is further arranged to multiply the frequency of the first reference clock signal by an integer.

7. The WLAN communication device of claim 1, wherein the frequency multiplier is further arranged to double the frequency of the first reference clock signal.

8. The WLAN communication device of claim 1, wherein the reference oscillator comprises a crystal oscillator.

9. The WLAN communication device of claim 8, wherein the crystal oscillator is an uncontrolled crystal oscillator.

10. The WLAN communication device of claim 1, wherein the fractional-N PLL unit further comprises a frequency divider arranged to convert the synthesizer signal into a divider signal by dividing the frequency of the synthesizer signal by a division factor.

11. The WLAN communication device of claim 10, wherein the fractional-N PLL unit further comprises a controller arranged to specify said division factor.

12. The WLAN communication device of claim 10, wherein the fractional-N PLL unit further comprises a comparator arranged to compare the divider signal with the second reference clock signal and to generate an error signal indicative of the difference between the divider signal and the second reference clock signal.

13. The WLAN communication device of claim 12, wherein the fractional-N PLL unit further comprises a charge pump arranged to provide a charge pulse indicative of the error signal to the loop filter.

14. The WLAN communication device of claim 13, wherein the loop filter is further arranged to generate the control voltage based upon the charge pulse provided by the charge pump.

15. An integrated circuit chip comprising a WLAN (Wireless Local Area Network) frequency synthesizer circuit for generating a synthesizer signal suitable for modulating a transmission signal and/or demodulating a reception signal, wherein the WLAN frequency synthesizer circuit comprises:
    a reference oscillator circuit for generating a first reference clock signal;
    a fractional-N PLL (Phase-Locked Loop) circuit for receiving a second reference clock signal and converting the second reference clock signal into the synthesizer signal; and
    a frequency multiplier circuit for receiving the first reference clock signal and converting the first reference clock signal into the second reference clock signal to be forwarded to the fractional-N PLL circuit by multiplying the frequency of the first reference clock signal by a multiplication factor;
    wherein the fractional-N PLL circuit comprises a VCO (Voltage Controlled Oscillator) circuit for outputting the synthesizer signal and a loop filter circuit for generating a control voltage for controlling the operation of the VCO circuit; and
    wherein the loop filter is further arranged to operate at a loop filter bandwidth narrower than or equal to one percent of the frequency of the second reference clock signal and broader than one percent of the frequency of the first reference clock signal.

16. The integrated circuit chip of claim 15, wherein the frequency multiplier circuit comprises a DLL (Delay-Locked Loop) circuit for multiplying the frequency of the first reference clock signal by said multiplication factor.

17. The integrated circuit chip of claim 15, wherein the frequency multiplier circuit comprises a mixer circuit for self-mixing the first reference clock signal.

18. The integrated circuit chip of claim 15, wherein the frequency multiplier circuit comprises a harmonic generator circuit for converting the first reference clock signal into a harmonic signal comprising at least one component at a frequency of an integer multiple of the frequency of the first reference clock signal.

19. The integrated circuit chip of claim 18, wherein the frequency multiplier circuit further comprises a filter circuit for selecting one of the at least one component of the harmonic signal as the second reference clock signal.

20. The integrated circuit chip of claim 15, wherein the reference oscillator circuit comprises a crystal clock oscillator circuit.

21. A method of operating a WLAN (Wireless Local Area Network) communication device, comprising generating, by a WLAN frequency synthesizer, a synthesizer signal suitable for modulating a transmission signal and/or demodulating a reception signal, wherein generating the synthesizer signal comprises:

generating a first reference clock signal by operating a reference oscillator;

receiving a second reference clock signal and converting the second reference clock signal into the synthesizer signal by a fractional-N PLL (Phase-Locked Loop) unit; and converting the first reference clock signal into the second reference clock signal to be forwarded to the fractional-N PLL unit by multiplying the frequency of the first reference clock signal by a multiplication factor by a frequency multiplier;

wherein converting the second reference clock signal into the synthesizer signal by the fractional-N PLL unit comprises outputting the synthesizer signal by a VCO (Voltage Controlled Oscillator) oscillator within the fractional-N PLL unit and generating a control voltage by a loop filter within the fractional-N PLL unit for controlling the operation of the VCO oscillator; and wherein generating the control voltage comprises operating the loop filter at a loop filter bandwidth narrower than or equal to one percent of the frequency of the second reference clock signal and broader than one percent of the frequency of the first reference clock signal.

22. The method of claim 21, wherein converting the first reference clock signal into the second reference clock signal by the frequency multiplier comprises operating a DLL (Delay-Locked Loop) unit for multiplying the frequency of the first reference clock signal by said multiplication factor.

23. The method of claim 21, wherein converting the first reference clock signal into the second reference clock signal by the frequency multiplier comprises self-mixing the first reference clock signal by a mixer.

24. The method of claim 21, wherein converting the first reference clock signal into the second reference clock signal by the frequency multiplier comprises converting, by a harmonic generator, the first reference clock signal into a harmonic signal comprising at least one component at a frequency of an integer multiple of the frequency of the first reference clock signal.

25. The method of claim 24, wherein converting the first reference clock signal into the second reference clock signal by the frequency multiplier further comprises selecting one of the at least one component of the harmonic signal as the second reference clock signal by a filter.

26. The method of claim 21, wherein generating the first reference clock signal by operating a reference oscillator comprises operating a crystal oscillator.

* * * * *